United States Patent
Giepen et al.

(10) Patent No.: US 10,451,242 B2
(45) Date of Patent: Oct. 22, 2019

(54) LIGHTING DEVICE FOR VEHICLES

(71) Applicant: Hella KGaA Hueck & Co., Lippstadt (DE)

(72) Inventors: Bernd Giepen, Erwitte (DE); Carsten Hohmann, Warstein (DE); Tobias Irmscher, Lippstadt (DE); Martin Muegge, Geseke (DE)

(73) Assignee: Hella KGaA Hueck & Co., Lippstadt (DE)

( * ) Notice: Subject to any disclaimer, the term of this patent is extended or adjusted under 35 U.S.C. 154(b) by 0 days.

(21) Appl. No.: 15/619,820

(22) Filed: Jun. 12, 2017

(65) Prior Publication Data

US 2017/0276313 A1   Sep. 28, 2017

Related U.S. Application Data

(63) Continuation of application No. PCT/EP2015/078807, filed on Dec. 7, 2015.

(30) Foreign Application Priority Data

Dec. 11, 2014 (DE) .................... 10 2014 118 378

(51) Int. Cl.
*F21S 43/13* (2018.01)
*F21S 43/237* (2018.01)
(Continued)

(52) U.S. Cl.
CPC .............. *F21S 43/13* (2018.01); *F21S 41/16* (2018.01); *F21S 43/237* (2018.01); *F21S 43/26* (2018.01); *G02B 5/0205* (2013.01); *G02B 19/0057* (2013.01); *G02B 27/48* (2013.01); *H01S 5/005* (2013.01); *H01S 5/4012* (2013.01); *G03H 1/2202* (2013.01)

(58) Field of Classification Search
CPC .......... F21S 43/13; F21S 43/237; F21S 43/10; F21S 43/26; H01S 5/4012; H01S 5/05; G02B 5/0205; G03H 1/2202
See application file for complete search history.

(56) References Cited

U.S. PATENT DOCUMENTS

| 5,791,757 A | 8/1998 | O'Neil et al. |
| 6,152,588 A | 11/2000 | Scifres |
| (Continued) | | |

FOREIGN PATENT DOCUMENTS

| DE | 19812794 A1 | 10/1998 |
| DE | 69805626 T2 | 9/2002 |
| (Continued) | | |

OTHER PUBLICATIONS

Trisnadi, J.I. "Speckle Contrast Reduction in Laser Projection Displays", Optomechatronic Micro/Nano Devices and Components, III, Jan. 1, 2002, pp. 131-137, vol. 4657.

*Primary Examiner* — Zheng Song
(74) *Attorney, Agent, or Firm* — Muncy, Geissler, Olds & Lowe, P.C.

(57) ABSTRACT

A lighting device for vehicles having a laser light source and an optical unit which is associated with the laser light source and which generates a predetermined light distribution. A diffusion element is arranged between the laser light source and the optical unit for reducing and/or preventing a speckle pattern in the light distribution.

8 Claims, 3 Drawing Sheets

(51) Int. Cl.
*F21S 43/20* (2018.01)
*G02B 5/02* (2006.01)
*G02B 27/48* (2006.01)
*G02B 19/00* (2006.01)
*H01S 5/00* (2006.01)
*H01S 5/40* (2006.01)
*F21S 41/16* (2018.01)
*G03H 1/22* (2006.01)

(56) References Cited

U.S. PATENT DOCUMENTS

| | | | |
|---|---|---|---|
| 6,895,149 B1 | 5/2005 | Jacob et al. | |
| 2006/0087841 A1* | 4/2006 | Chern | G01J 1/32 362/231 |
| 2006/0092515 A1 | 5/2006 | Kim et al. | |
| 2008/0094851 A1 | 4/2008 | Engl et al. | |
| 2008/0129891 A1 | 6/2008 | Prudnikov | |
| 2008/0165401 A1 | 7/2008 | Kasazumi | |
| 2008/0278692 A1 | 11/2008 | Sanders et al. | |
| 2010/0110364 A1 | 5/2010 | Teunissen et al. | |
| 2010/0141898 A1 | 6/2010 | Moussa | |
| 2011/0285967 A1* | 11/2011 | Gollier | G02B 27/48 353/20 |
| 2012/0044464 A1 | 2/2012 | Sqalli et al. | |
| 2012/0218615 A1 | 8/2012 | Yasuda | |
| 2014/0133798 A1* | 5/2014 | Wu | G02B 6/43 385/14 |
| 2016/0207450 A1* | 7/2016 | Fuentes | B60Q 1/346 |
| 2017/0175967 A1* | 6/2017 | Shimizu | F21S 41/00 |

FOREIGN PATENT DOCUMENTS

| | | |
|---|---|---|
| DE | 102005016872 A1 | 10/2006 |
| DE | 10 2005 020 085 A1 | 11/2006 |
| DE | 102013002098 A1 | 8/2014 |
| DE | 10 2013 008 372 A1 | 11/2014 |
| FR | 2709172 A1 | 2/1995 |
| JP | H 11101925 A | 4/1999 |
| JP | 2014 017060 A | 1/2014 |
| WO | WO 2008/021158 A2 | 2/2008 |

* cited by examiner

LIGHTING DEVICE FOR VEHICLES

This nonprovisional application is a continuation of International Application No. PCT/EP2015/078807, which was filed on Dec. 7, 2015, and which claims priority to German Patent Application No. 10 2014 118 378.9, which was filed in Germany on Dec. 11, 2014, and which are both herein incorporated by reference.

BACKGROUND OF THE INVENTION

Field of the Invention

The invention relates to a lighting device for vehicles having a laser light source and having an optical unit associated with the laser light source in order to generate a predetermined light distribution.

Description of the Background Art

A lighting device for vehicles is known from DE 197 46 025 B4, which corresponds to U.S. Pat. No. 5,700,078, and in which a laser light source is used as a light source. Associated with the laser light source is an optical unit by means of which the light emitted by the laser light source is deflected such that it is emitted in the desired direction to generate a predetermined light distribution. If the lighting device is intended to illuminate a lamp lens of the tail light in order to provide a signal function at the rear of the vehicle, then a mottled illumination with a high-contrast, grainy structure arises due to a speckle effect. This speckle pattern in the illumination of a signal function is perceived as distracting for the observer from outside.

SUMMARY OF THE INVENTION

It is therefore an object of the present invention to improve a lighting device for vehicles having a laser light source such that a predetermined light distribution with a uniform or homogeneous structure is achieved, in particular wherein the occurrence of a speckle pattern is reduced or avoided.

In an exemplary embodiment, to attain this object, the invention provides a diffusion element for reducing and/or avoiding a speckle pattern in the light distribution between the laser light source and the optical unit.

An advantage of the invention includes that a homogeneous illumination is achieved in a simple manner by the introduction of an additional component, namely a diffusion element for reducing or avoiding a speckle pattern. First of all, in the case of a signal function, the light-emitting area can be made homogeneous. Second of all, an illuminated area outside of the vehicle can be made homogeneous.

According to an embodiment of the invention, the diffusion element can be arranged directly in front of the laser light source in the direction of emission, so that the space required by the lighting device is not increased.

According to an embodiment of the invention, the diffusion element can be implemented as a scattering lens or as a diffuser film. This has the advantageous result that the light emitted by the laser light source is expanded and can be scattered non-uniformly, so that the speckle effect is reduced by means of the light distribution produced by the downstream optical unit.

According to an embodiment of the invention, the diffusion element can be implemented as an elastic membrane that, by means of an electric voltage source, executes an extension/compression motion in its longitudinal plane in accordance with a predetermined frequency. The diffusion element can be implemented as an active component that is supplied with power. The elastic membrane can be made of a polymer material. The extension/compression motion can be carried out with a frequency in the range from 150 to 350 Hz. The frequency is dependent on the laser light source used or on the light function to be produced.

According to an embodiment of the invention, the elastic membrane can be subjected to an extension/compression motion with a time shift from a switch-on or switch-off time of the laser light source so that the observer perceives a change between a homogeneous and a mottled illumination pattern. In this way, the observer's attention can be additionally directed to the signal function.

According to an embodiment of the invention, the diffusion element can be implemented as a light guide element so that a scattering is produced as a result of the multiple total internal reflection of the light at a lateral surface of the light guide element such that illumination with a reduced speckle pattern can take place when light is emitted at the light output side of the light guide element. The light guide has a length such that the emerging light has a uniform light distribution. According to an embodiment of the invention, the light guide element can have multiple light input branches, each of which has a laser light source associated with it. The superposition of radiation intensities of multiple laser light sources that takes place as a result leads to a reduction in the speckle effect.

According to an embodiment of the invention, the diffusion element can be implemented as a diffractive optical element or as a holographic optical element that is designed or calculated such that a desired scattering or phase shift is achieved, by which means the speckle effect is reduced or eliminated. The holographic optical element has a hologram structure of a nature such that the light beam striking it is scattered.

To attain the object, the invention provides multiple laser light sources so that the light distribution is formed by the superposition of multiple illumination patterns, in order to reduce and/or avoid a speckle pattern in the light distribution.

An advantage of the invention includes that the multiplicity of laser light sources can be used not only to reduce the speckle pattern, but also to increase the light intensity. Alternatively, multiple lower intensity laser light sources can also be used so that the manufacturing costs are reduced.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

A lighting device according to the invention for vehicles can be used, for example, in the front end and rear end region for producing signal functions, for example daytime running lights, tail lights, brake lights, cornering lights. In the front end region, the lighting device can serve to produce a high beam/low beam distribution. The lighting device thus serves to generate a predetermined light distribution with which an area outside the vehicle is illuminated or with which a light-emitting area of the lighting device is provided. The light-emitting area is preferably a lamp lens of the lighting device that covers or seals a housing of the lighting device.

Figure 1:
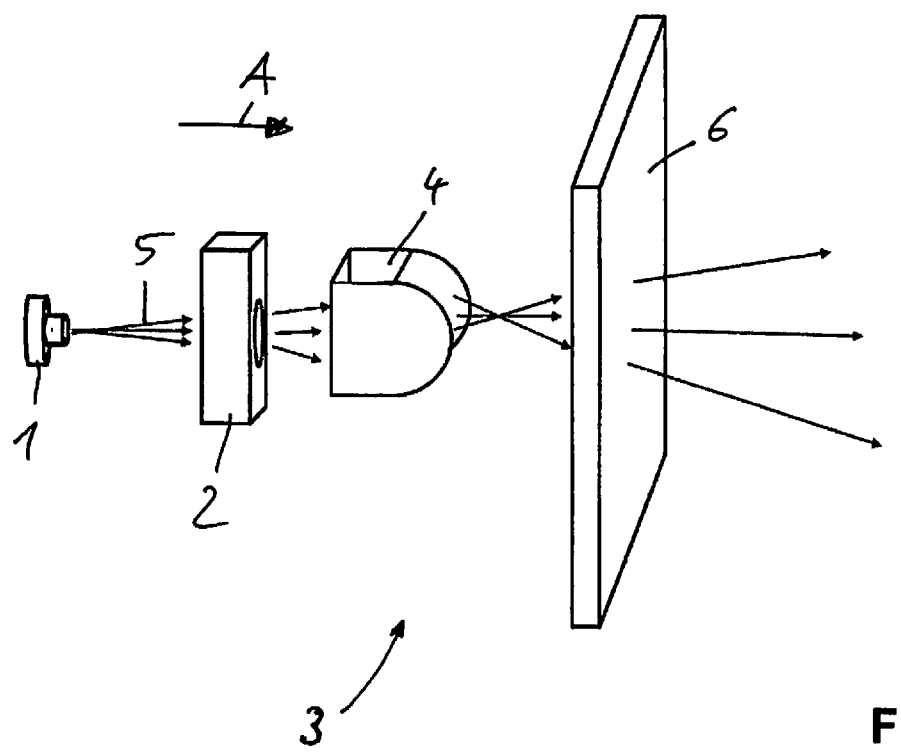
FIG. 1 is a schematic side view of a lighting device according to an embodiment.

According to a first embodiment of the lighting device from FIG. 1, the lighting device has a laser light source 1, a diffusion element 2 arranged in front of the laser light source 1 in the direction of emission A of said light source for the purpose of reducing and/or avoiding a speckle pattern in a light distribution produced by the lighting device, as well as an optical unit 3 arranged in front of said diffusion element 2 in the direction of emission A. The optical unit 3 includes a lens 4, by means of which light 5 emitted by the laser light source 1 is projected in accordance with a predetermined light distribution. In addition, the optical unit 3 has a lamp lens 6—that preferably is designed to be transparent, like the lens 4—arranged in front of the lens 4 in the direction of emission A. If the lighting device is a tail light with signaling function, the diffusion element 2 achieves a homogeneous and uniform illumination pattern on the lamp lens 6.

The diffusion element 2 is implemented as an active component that provides an elastic membrane which is positioned between two electrodes connected to an electric voltage source. When the diffusion element 2 is switched on and a voltage in a predetermined frequency range, for example 150 to 350 Hz, is applied thereto, an extension/compression motion of the elastic membrane takes place in its longitudinal plane, which is perpendicular to the direction of emission A. By this means, a scattering of the light 5 is made possible, which results in the homogeneous illumination pattern.

The diffusion element 2 can be arranged directly in front of the laser light source 1 in the direction of emission A. FIG. 1 shows merely a schematic representation of the configuration of this lighting device.

For example, the diffusion element 2 can be switched on and/or off with a time shift from the laser light source 1. The non-time-synchronous switching on and/or off of the laser light source 1 and diffusion element 2 achieves the result that the observer sometimes perceives the homogeneous illumination pattern (diffusion element switched on) and sometimes perceives the non-homogeneous illumination pattern (diffusion element switched off). In this way, the attention-getting character of the signal function can be further increased, for example if the diffusion element 2 is switched on after the laser light source 1 by a time lag.

The laser light source 1 can be implemented as a laser light source emitting a red light, so that no conversion of the light in, e.g., a white color of the spectrum is required. Consequently, the components of the optical unit 3 can be transparent in design in order to produce the tail light or brake light function.

Figure 2:
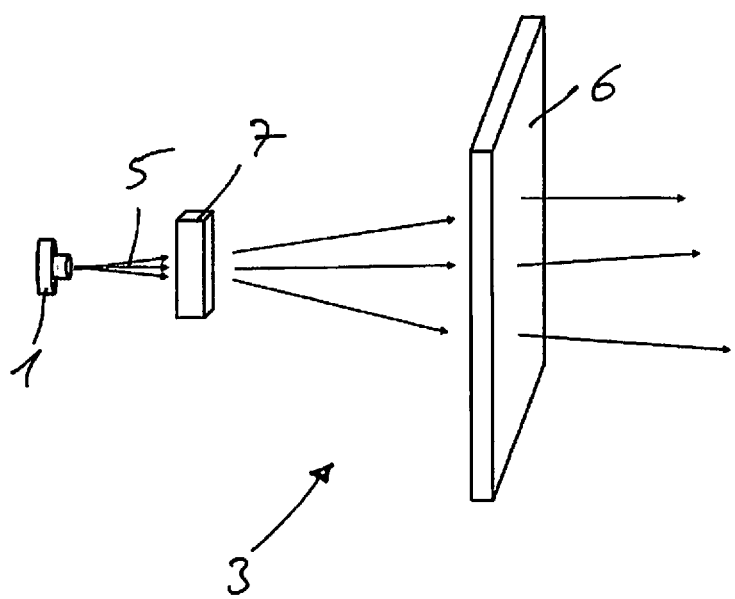
FIG. 2 is a schematic side view of the lighting device according to an embodiment.

According to an embodiment of the invention from FIG. 2, a diffuser film or a scattering lens can be provided as diffusion element 7 for reducing and/or avoiding a speckle pattern in the light distribution. What is involved here is a passive component that is not supplied with electric power, but instead brings about a scattering of the light 5 on account of its design. This diffusion element 7 causes an expansion of the laser beam 5. In particular, the laser light 5 is scattered non-uniformly so that a homogeneous illumination area with a reduced speckle pattern or with no speckle pattern at all appears on the downstream lamp lens 6.

Figure 3:
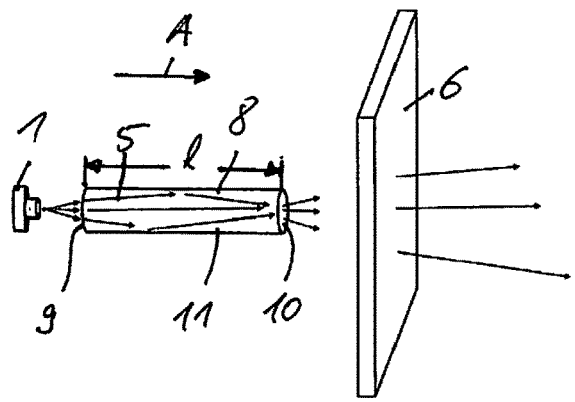
FIG. 3 is a schematic side view of the lighting device according to an embodiment.

According to an embodiment of the invention from FIG. 3, the diffusion element for reducing and/or avoiding a speckle pattern in the light distribution or in an illumination area is implemented as a light guide element 8. The light guide element 8 has a light input surface 9 facing the laser light source 1 and a light output surface 10 facing away from the laser light source 1, between which extends a cylindrical lateral surface 11. The light 5 coupled in through the light input surface 9 undergoes multiple total internal reflection at the lateral surface 11 within the light guide element 8 before it is emitted toward the lamp lens 6 at the light output side through the light output surface 10. The multiple total internal reflection permits a scattering to prevent or reduce the speckle pattern, for example on the lamp lens 6. The light guide element 8 may have a length l that is greater than a coherence length of the laser light source 1 or of the laser light 5. The emerging light 5 has a uniform light distribution here. The light guide element 8 can be made of a transparent material or of a material mixture with a low diffusivity. The light guide element 8 can be rigid or flexible, for example can be implemented as a glass fiber light guide element or as a silicone light guide element.

Figure 4:
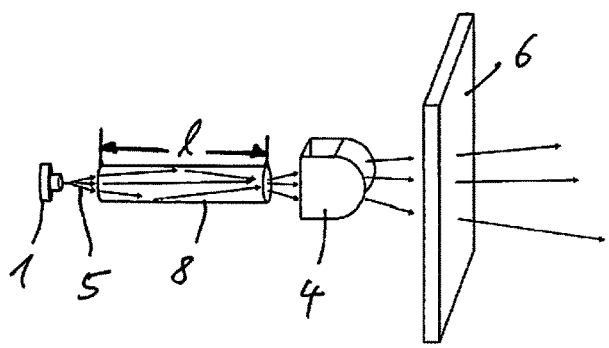
FIG. 4 is a schematic side view of the lighting device according to an embodiment.

According to an embodiment of the invention from FIG. 4, a lens 4 can be arranged between the light guide element 8 and the lamp lens 6.

According to an embodiment of the invention, the optical unit 3 can also have a Fresnel lens, aspheric lenses, or freeform lenses as the lens 4. According to another embodiment, the optical unit 3 can also have a reflector instead of the lens 4.

Figure 5:
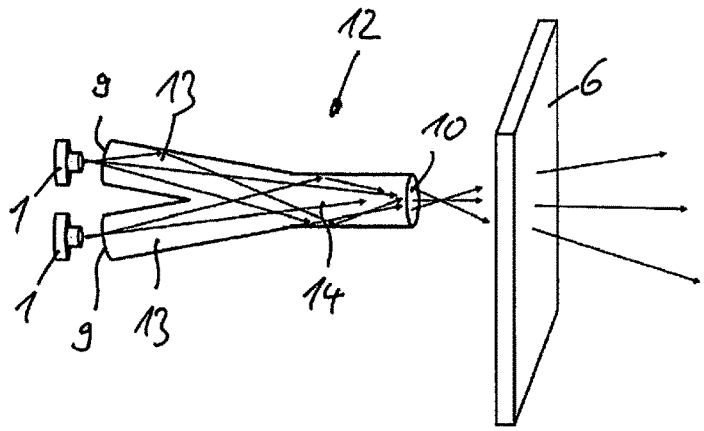
FIG. 5 is a schematic side view of the lighting device according to an embodiment.

According to an embodiment of the invention from FIG. 5, a light guide element 12 can be provided that has a multiplicity of light input branches 13. In the present example embodiment, the light guide element 12 has two light input branches 13, each of which has associated with it a laser light source 1. The light guide element 12 thus has two light input surfaces 9 by means of which the light emitted by the different laser light sources 1 is brought together in a main section 14 of light guide element 12 and is then coupled out toward the lamp lens 6 at the shared light output surface 10. A superposition of the radiation intensities of the two laser light sources 1 takes place in the main section 14 of the light guide element 12, resulting in a reduction in the speckle effect.

According to an embodiment of the invention, the diffusion element for reducing and/or avoiding the speckle pattern can also be implemented through a diffractive optical element and/or through a holographic optical element. The hologram structure of the holographic optical element is calculated such that a desired scattering or phase shifting of the laser light 5 is achieved, with the result that the speckle effect or the speckle pattern is reduced or avoided.

Figure 6:
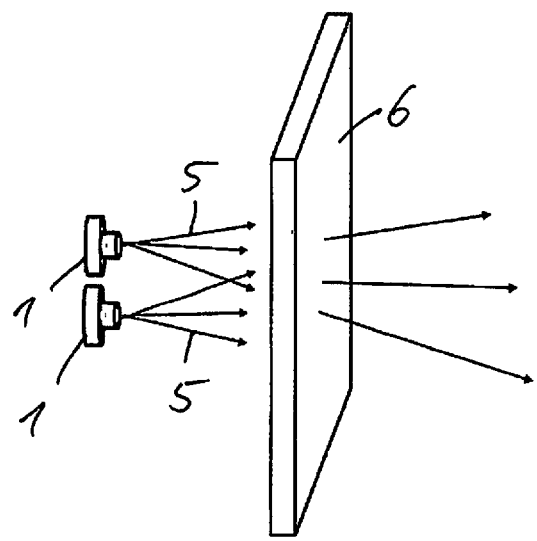
FIG. 6 is a schematic side view of the lighting device according to an embodiment.

According to an embodiment of the invention from FIG. 6, in order to reduce and/or avoid a speckle pattern in the light distribution, multiple laser light sources 1, in the present case two laser light sources 1, are provided that emit laser light 5 toward the lamp lens 6. Occurring as a result are a superposition of the laser beams produced by the different laser light sources 1, and hence a superposition of the individual illumination patterns. As a result, the speckle effect can be reduced.

Figure 7:
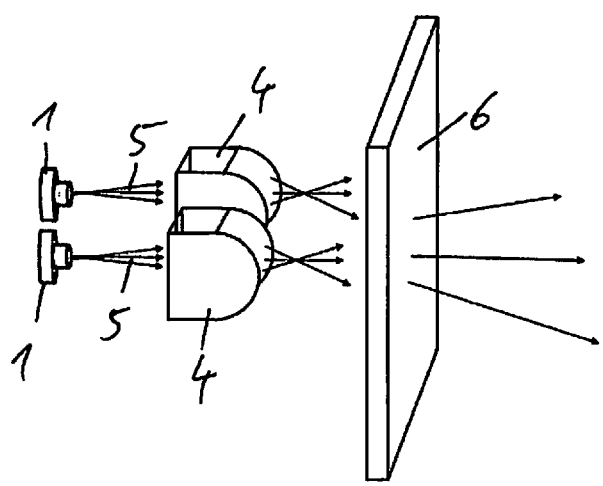
FIG. 7 is a schematic side view of the lighting device according to an embodiment.

According to an embodiment of the invention from FIG. 7, a lens 4 associated with each of the laser light sources 1 can be arranged between the laser light sources 1 and the lamp lens 6. As a result, a predetermined light distribution or illumination pattern can be created, preferably outside the vehicle.

It is a matter of course that the features cited above can each be used individually or in any desired combination of more than one.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A lighting device for a vehicle, the lighting device comprising:
   at least two laser light sources;
   an optical unit associated with the at least two laser light sources to generate a predetermined light distribution; and
   a diffusion element for reducing and/or avoiding a speckle pattern in the light distribution is arranged between the at least two laser light sources and the optical unit;
   wherein the diffusion element is a light guide element having a length such that the emerging light has a uniform light distribution,
   wherein the light guide element has a main section and at least two light input branches, each of the at least two light input branches having a respective laser light source, out of the at least two laser light sources, associated therewith,
   wherein the at least two light input branches merge together at the main section of the light guide element,
   wherein the at least two light input branches and the main section are each formed of a single straight section, and
   wherein the at least two light input branches are angled with respect to the main section.

2. The lighting device according to claim 1, wherein the diffusion element is positioned directly in front of the at least two laser light sources in a direction of emission.

3. The lighting device according to claim 1, wherein the diffusion element is a scattering lens or a diffuser film.

4. The lighting device according to claim 1, wherein the diffusion element is a diffractive optical element or a holographic optical element.

5. The lighting device according to claim 1, wherein the at least two laser light sources emit a red light.

6. The lighting device according to claim 1, wherein the optical unit includes a lens and a lamp lens, wherein the lens is positioned between the diffusion element and the lamp lens.

7. The lighting device according to claim 1, wherein the at least two light input branches and the main section are each formed of a single straight section, such that the at least two light input branches and the main section each extend along a separate, respective axis.

8. The lighting device according to claim 1, wherein each of the at least two light input branches has a light input surface that opposes the at least two laser light sources, respectively, and wherein the light input surface of each of the at least two light input branches form exterior surfaces of the light guide element.

* * * * *